United States Patent
Hyun et al.

(10) Patent No.: US 12,395,183 B2
(45) Date of Patent: Aug. 19, 2025

(54) TIME DOMAIN ANALOG-TO-DIGITAL CONVERTER AND ANALOG-TO-DIGITAL CONVERTING METHOD

(71) Applicants: Samsung Electronics Co., Ltd., Suwon-si (KR); Korea University Research and Business Foundation, Seoul (KR)

(72) Inventors: Jihwan Hyun, Suwon-si (KR); Chulwoo Kim, Suwon-si (KR); Sooho Park, Suwon-si (KR); Junghwan Choi, Suwon-si (KR)

(73) Assignees: Samsung Electronics Co., Ltd., Gyeonggi-do (KR); Korea University Research and Business Foundation, Seoul (KR)

( * ) Notice: Subject to any disclaimer, the term of this patent is extended or adjusted under 35 U.S.C. 154(b) by 259 days.

(21) Appl. No.: 18/335,572

(22) Filed: Jun. 15, 2023

(65) Prior Publication Data
US 2024/0178857 A1 May 30, 2024

(30) Foreign Application Priority Data
Nov. 28, 2022 (KR) ........................ 10-2022-0161571

(51) Int. Cl.
*H03M 1/38* (2006.01)
*H03M 1/12* (2006.01)

(52) U.S. Cl.
CPC ............ *H03M 1/38* (2013.01); *H03M 1/1245* (2013.01)

(58) Field of Classification Search
CPC ................................. H03M 1/38; H03M 1/12
(Continued)

(56) References Cited

U.S. PATENT DOCUMENTS

| 8,009,486 B2 | 8/2011 | Kim |
| 8,400,847 B2 | 3/2013 | Kim |

(Continued)

FOREIGN PATENT DOCUMENTS

KR 10-0945802 B1 3/2010

OTHER PUBLICATIONS

S.Naraghi 'Time-Based Analog to Digital Converters' A dissertation submitted in partial fulfillment of the requirements for the degree of Doctor of Philosophy (Electrical Engineering) in The University of Michigan, 2009, pp. 1-118.

(Continued)

*Primary Examiner* — Peguy Jean Pierre
(74) *Attorney, Agent, or Firm* — Harness, Dickey & Pierce, P.L.C.

(57) ABSTRACT

In analog-to-digital conversion, a plurality of stages configured in a sequence to sequentially decide a plurality of bits in successive-approximation, each of the plurality of stages configured to operate in response to a corresponding clock among a plurality of clocks, and decide a corresponding bit among the plurality of bits from a corresponding positive pulse among a plurality of positive pulses and a corresponding negative pulse among a plurality of negative pulses; and a plurality of clock generating circuits respectively corresponding to a plurality of first stages among the plurality of stages, each of the plurality of clock generating circuit configured to generate the corresponding clock of a corresponding stage among the plurality of first stages based on an operation of a previous stage among the plurality of stages, the previous stage being before the corresponding stage in the sequence.

20 Claims, 11 Drawing Sheets

(58) Field of Classification Search
USPC .................................................. 341/161, 155
See application file for complete search history.

(56) References Cited

U.S. PATENT DOCUMENTS

| | | | |
|---|---|---|---|
| 8,693,263 B2 | 4/2014 | Kim | |
| 9,484,945 B1 | 11/2016 | Wan et al. | |
| 9,584,144 B1 | 2/2017 | Zhou et al. | |
| 9,614,540 B1 | 4/2017 | Kull et al. | |
| 9,660,664 B1 | 5/2017 | Price et al. | |
| 9,685,972 B1 | 6/2017 | Xun et al. | |
| 9,893,737 B1 * | 2/2018 | Keramat | H03K 5/08 |
| 10,061,272 B2 | 8/2018 | Chiu et al. | |
| 10,116,318 B1 | 10/2018 | Sharif et al. | |
| 11,133,812 B1 | 9/2021 | Lebedev et al. | |
| 2004/0217895 A1 * | 11/2004 | Koyanagi | H03M 1/145 |
| | | | 341/161 |
| 2009/0135037 A1 * | 5/2009 | Agarwal | H03M 1/0624 |
| | | | 341/143 |
| 2009/0316493 A1 | 12/2009 | Kim | |
| 2011/0286285 A1 | 11/2011 | Kim | |
| 2011/0286286 A1 | 11/2011 | Kim | |
| 2019/0207613 A1 * | 7/2019 | Robl | H03K 5/135 |

OTHER PUBLICATIONS

J. Liu et al. 'A 10GS/s 8b 25fJ/c-s 2850um2 Two-Step Time-Domain ADC Using Delay-Tracking Pipelined-SAR TDC with 500fs Time Step in 14nm CMOS Technology' *ISSCC 2022 / Session 10 / Nyquist and Incremental ADCS* / 10.1, 2022, pp. 160-163.

* cited by examiner

1100

TIME DOMAIN ANALOG-TO-DIGITAL CONVERTER AND ANALOG-TO-DIGITAL CONVERTING METHOD

CROSS-REFERENCE TO RELATED APPLICATION

This application claims priority to and the benefit of Korean Patent Application No. 10-2022-0161571 filed in the Korean Intellectual Property Office on Nov. 28, 2022, the entire contents of which are incorporated herein by reference.

BACKGROUND

(a) Field

The disclosure relates to a time domain analog-to-digital converter and an analog-to-digital converting method.

(b) Description of the Related Art

An analog-to-digital converter (ADC) receives an analog input voltage and converts it into a digital signal that can be sent to other devices. ADCs may be used in various signal processing devices.

A voltage domain ADC outputs the difference in input voltages as a digital value. This process may take a while due to a settling time of a capacitor and a decision time of a comparator.

SUMMARY

Some example embodiments may provide a time domain analog-to-digital converter and an analog-to-digital converting method for reducing a waiting time.

According to some example embodiments, an analog-to-digital converter may include a plurality of stages and a plurality of clock generating circuits. The plurality of stages may be configured in a sequence to sequentially decide a plurality of bits in a successive-approximation. Each of the plurality of stages configured to operate in response to a corresponding clock among a plurality of clocks, and decide a corresponding bit among the plurality of bits from a corresponding positive pulse among a plurality of positive pulses and a corresponding negative pulse among a plurality of negative pulses, the plurality of positive pulses respectively input to the plurality of stages and the plurality of negative pulses respectively input to the plurality of stages. The plurality of clock generating circuits respectively correspond to a plurality of first stages among the plurality of stages. Each of the plurality of clock generating circuit may generate the corresponding clock of a corresponding stage among the plurality of first stages based on an operation of a previous stage among the plurality of stages, the previous stage being before the corresponding stage in the sequence.

According to some example embodiments, an analog-to-digital converter may include a first time comparator, a first delay circuit, a clock generating circuit, a second time comparator, and a second delay circuit. The first time comparator may operate in response to a first clock and decide a first bit based on a first comparison result of comparing a first positive pulse and a first negative pulse. The first delay circuit may delay either one of the first positive pulse and the first negative pulse by a first reference time based on a value of the first comparison result. The clock generating circuit may generate a second clock in response to the first comparison result. The second time comparator may operate in response to the second clock and decide a second bit based on a second comparison result of comparing a second positive pulse and a second negative pulse output from the first delay circuit. The second delay circuit may delay either one of the second positive pulse and the second negative pulse by a second reference time based on a value of the second comparison result.

According to some example embodiments, an analog-to-digital converting method may be provided. The analog-to-digital converting method may include receiving a first positive pulse and a first negative pulse, comparing the first positive pulse and the first negative pulse in response to a first clock to generate a first comparison result, deciding a first bit based on a value of the first comparison result, outputting a second positive pulse and a second negative pulse by delaying either one of the first positive pulse and the first negative pulse by a first reference time based on a value of the first comparison result, generating a second clock in response to the first comparison result, comparing the second positive pulse and the second negative pulse in response to the second clock to generate a second comparison result, and deciding a second bit based on a value of the second comparison result.

DETAILED DESCRIPTION OF THE EXAMPLE EMBODIMENTS

Figure 1:
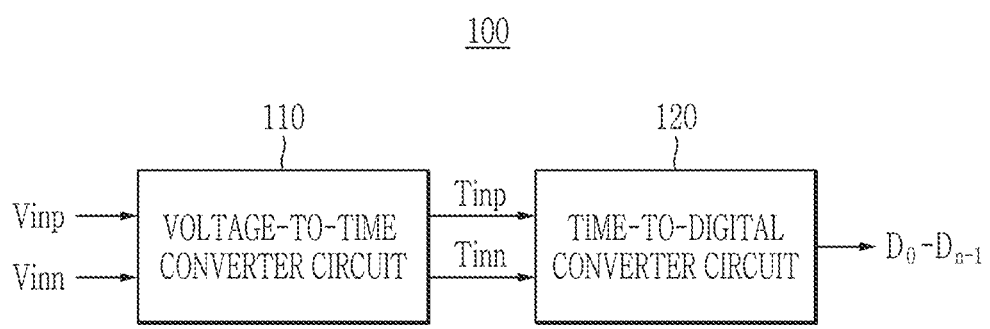
FIG. 1 is a block diagram illustrating an example of an analog-to-digital converter according to some example embodiments.

In the following detailed description, only certain example embodiments of the present invention have been shown and described, simply by way of illustration. As those skilled in the art would realize, the described example embodiments may be modified in various different ways, all without departing from the spirit or scope of the present invention.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

FIG. 1 is a block diagram illustrating an example of an analog-to-digital converter according to some example embodiments.

Referring to FIG. 1, an analog-to-digital converter 100 according to some example embodiments may include a voltage-to-time converter (VTC) circuit 110 and a time-to-digital converter (TDC) circuit 120.

The VTC circuit 110 may receive an analog signal and convert the analog signal into a time domain to generate a pulse. The analog signal may include a differential input voltage Vinp and Vinn. The pulse may include a positive pulse (or non-inverting pulse) Tinp generated based on a positive input voltage (or non-inverting input voltage) Vinp of the differential input voltage and a negative pulse (or inverting pulse) Tinn generated based on a negative input voltage (or inverting input voltage) Vinn of the differential input voltage. A time difference between a start edge (e.g., a rising edge) of the positive pulse Tinp and a start edge (e.g., a rising edge) of the negative pulse Tinn may be decided based on a voltage difference (e.g., correspond to a voltage difference) between the positive input voltage Vinp and the negative input voltage Vinn.

The TDC circuit 120 may receive the pulses Tinn and Tinp as input values in a time domain, and sequentially decide a plurality of bits (e.g., n bits) $D_0$ to $D_{n-1}$ from the pulses Tinn and Tinp in a successive-approximation. When deciding a bit $D_i$ in a stage, the TDC circuit 120 may generate a clock to be used in a next stage. Here, i is an integer between 1 and n). That is, each stage of the TDC circuit 120 may decide a bit $D_i$ in response to a clock generated according to an operation of a previous stage. In this case, the first stage (or a start stage) of the TDC circuit 120 may decide the first bit (e.g., the most significant bit among the plurality of bits) $D_0$ in response to an input clock.

Figure 2:
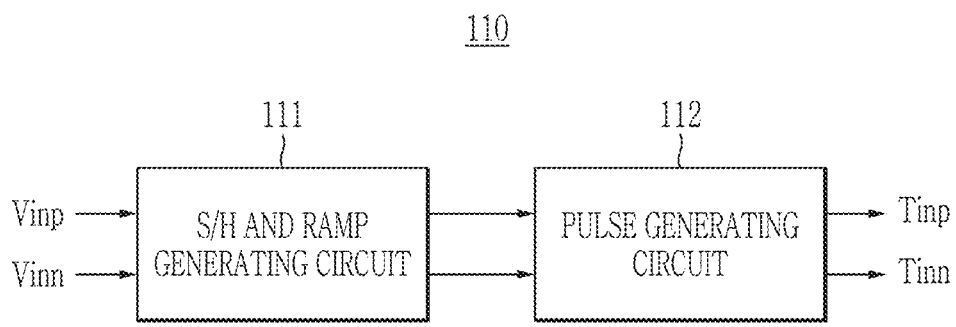
FIG. 2 is a block diagram showing an example of a voltage-to-time converter circuit of an analog-to-digital converter according to some example embodiments.
Figure 3:
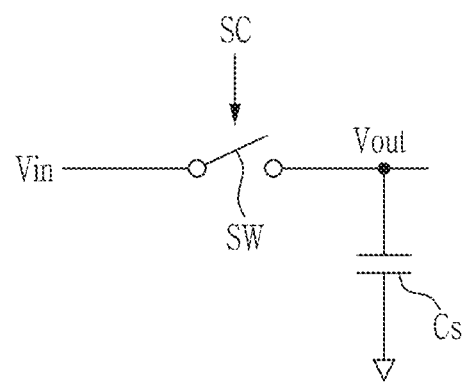
FIG. 3 is a circuit diagram illustrating an example of a sample/hold and ramp generating circuit in a voltage-to-time converter circuit shown in FIG. 2.
Figure 4:
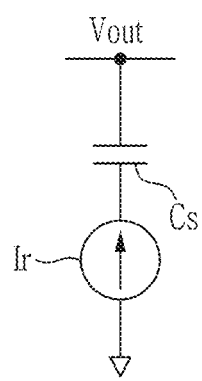
FIG. 4 is a circuit diagram illustrating an example of a pulse generating circuit in a voltage-to-time converter circuit shown in FIG. 2.
Figure 5:
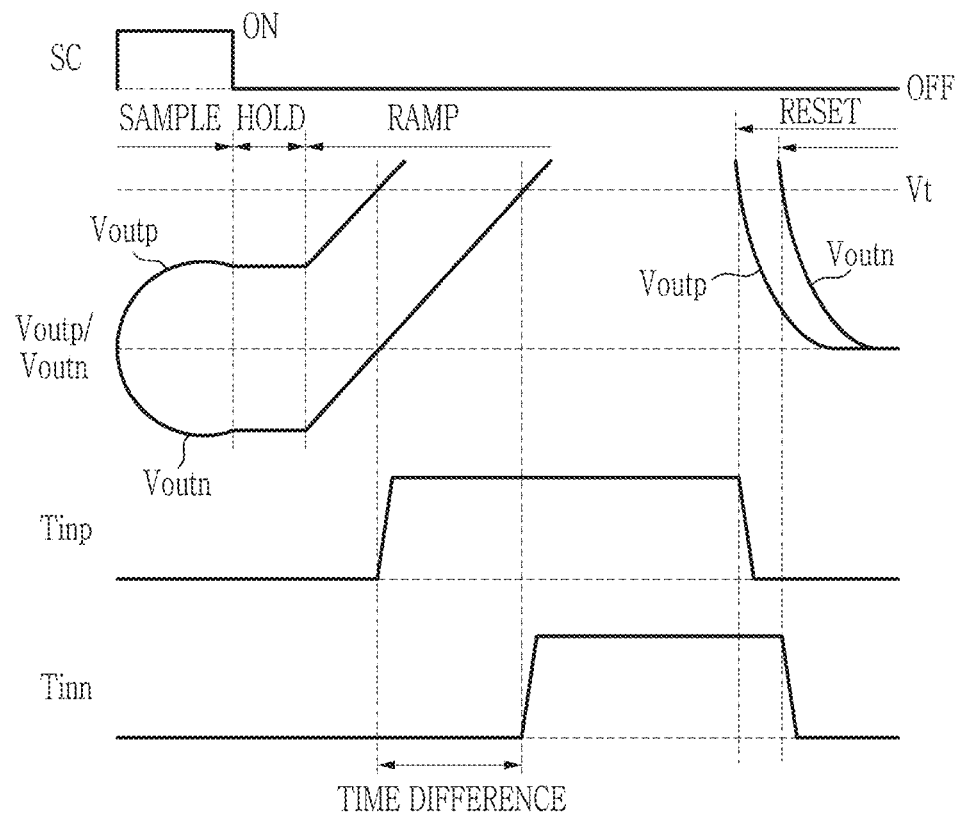
FIG. 5 is a diagram illustrating an example of a signal generated by a voltage-to-time converter circuit shown in FIG. 2.

FIG. 2 is a block diagram showing an example of a VDC circuit of an analog-to-digital converter according to some example embodiments, FIG. 3 is a circuit diagram illustrating an example of a sample/hold (S/H) and ramp generating circuit in a VDC circuit shown in FIG. 2, FIG. 4 is a circuit diagram illustrating an example of a pulse generating circuit in a VDC circuit shown in FIG. 2, and FIG. 5 is a diagram illustrating an example of a signal generated by a VDC circuit shown in FIG. 2.

Referring to FIG. 2, a VTC circuit 110 according to some example embodiments may include an S/H and ramp generating circuit 111 and a pulse generating circuit 112.

The S/H and ramp generating circuit 111 may sample a positive input voltage Vinn and hold the sampled voltage at a predetermined (or alternatively, desired) point in time. Similarly, the S/H and ramp generating circuit 111 may sample a negative input voltage Vinp and hold the sampled voltage at a predetermined (or alternatively, desired) point in time. In some example embodiments, as shown in FIG. 3 and FIG. 5, the S/H and ramp generating circuit 111 may close a switch SW in response to an ON level of a sampling control signal SC to sample an input voltage Vin to a capacitor Cs. In addition, the S/H and ramp generating circuit 111 may hold a voltage Vout sampled in the capacitor Cs by opening the switch SW in response to an OFF level of the sampling control signal SC. In FIG. 3, the input voltage Vin may be the positive input voltage Vinp or the negative input voltage Vinn shown in FIG. 2, and the sampled voltage Vout may be a positive voltage Voutp or a negative voltage Voutn shown in FIG. 5.

The S/H and ramp generating circuit 111 may increase the voltage Voutp obtained from sampling the positive input voltage Vinp in a ramp form, and increase the voltage Voutn obtained from sampling the negative input voltage Vinn in a ramp form as well. In some example embodiments, as shown in FIG. 4 and FIG. 5, the S/H and ramp generating circuit 111 may inject a current Ir into the capacitor Cs to increase the voltage Vout sampled in the capacitor Cs in the ramp form. In FIG. 4, the voltage Vout may be the positive voltage Voutp or the negative voltage Voutn shown in FIG. 5.

The pulse generating circuit 112 may generate a pulse Tinp having a predetermined (or alternatively, desired) level (or a first level) from a point in time at which the voltage Voutp, which increases in the ramp form, becomes a predetermined (or alternatively, desired) voltage Vt, and the voltage Voutp increases in a ramp form, and generate a pulse Tinn having the predetermined (or alternatively, desired) level from a point in time at which the voltage Voutn becomes the predetermined (or alternatively, desired) voltage Vt. The predetermined (or alternatively, desired) level may be, for example, a high level. In this case, the pulses Tinp and Tinn may be switched from a low level to the high level at the point in time when the voltages Voutp and Voutn, which increase in the ramp form, become the predetermined (or alternatively, desired) voltage Vt. In FIG. 5, since the positive input voltage Vinp is higher than the negative input voltage Vinn, a start edge (e.g., a rising edge) of the pulse Vinp generated based on the positive input voltage Vinp may be earlier than a start edge (e.g., a rising edge) of the pulse Vinn generated based on the negative input voltage Vinn. Next, the pulse generating circuit 112 may reset the voltages Vinp and Vinn increasing in the ramp form at appropriate timings. When the voltages Vinp and Vinn fall below the predetermined (or alternatively, desired) voltage Vt, the pulses Tinp and Tinn may be switched to the low level (or a second level). Accordingly, the pulse generating circuit 112 may generate the pulses Tinp and Tinn in the time domain. In this case, the time difference between the start edge of the pulse Tinp and the start edge of the pulse Tinn may be determined based on the voltage difference between the input voltage Vinp and the input voltage Vinn.

Figure 6:
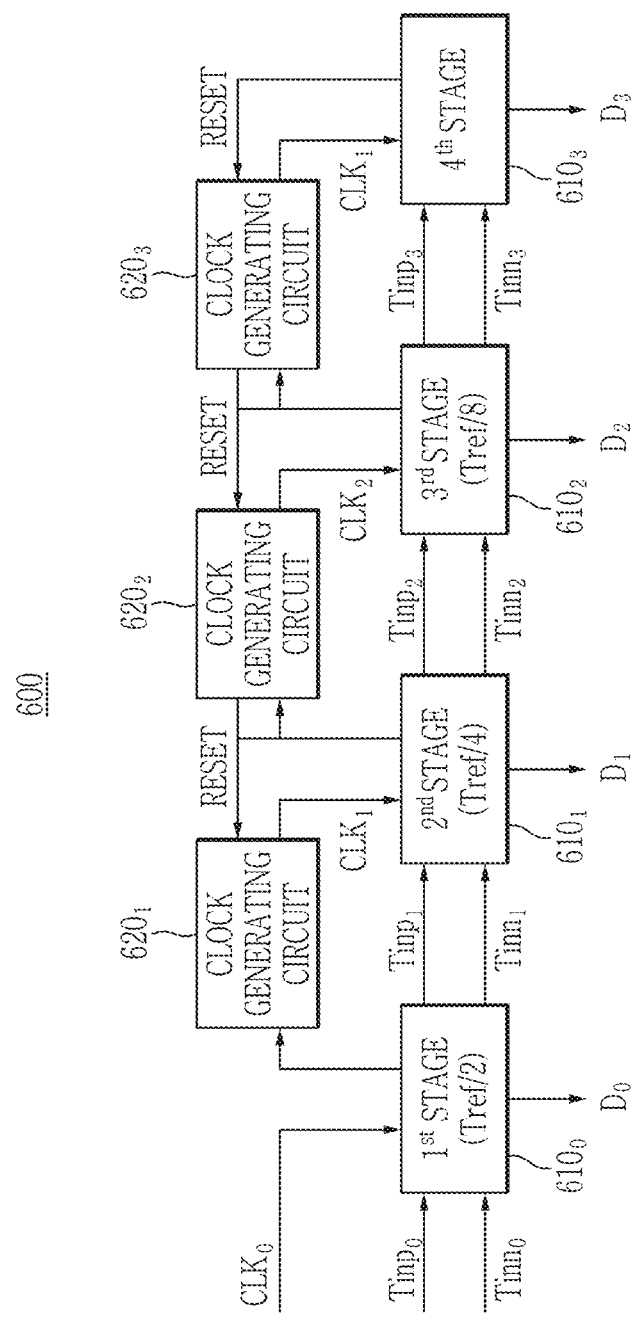
FIG. 6 is a block diagram illustrating an example of a voltage-to-time converter circuit of an analog-to-digital converter according to some example embodiments.
Figure 7:
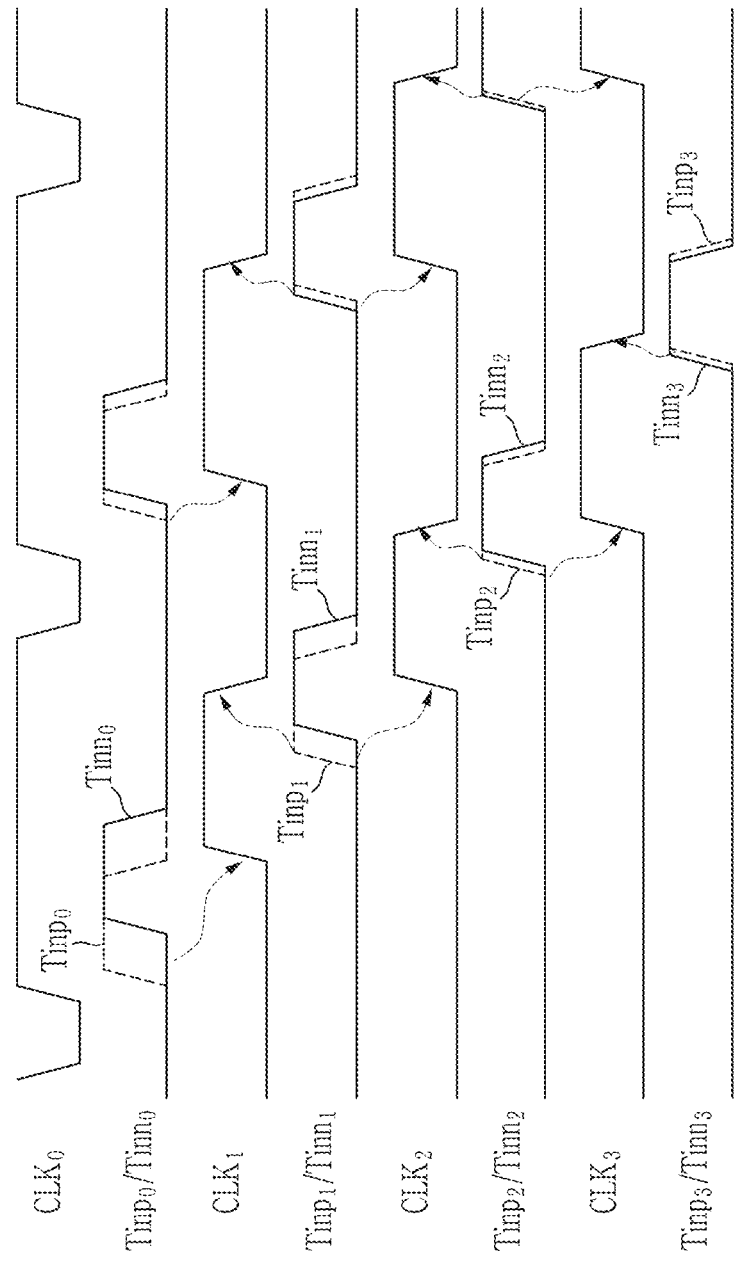
FIG. 7 is a diagram illustrating an example of a signal generated by a voltage-to-time converter circuit shown in FIG. 6.

FIG. 6 is a block diagram illustrating an example of a TDC circuit of an analog-to-digital converter according to some example embodiments, and FIG. 7 is a diagram illustrating an example of a signal generated by a TDC circuit shown in FIG. 6.

Referring to FIG. 6, a TDC circuit 600 according to some example embodiments may include a plurality of stages $610_0$, $610_1$, $610_2$, and $610_3$, and one or more clock generating circuits $620_1$, $620_2$, and $620_3$. Although FIG. 6 shows four stages $610_1$ to $610_3$ and three clock generating circuits $620_1$ to $620_3$, the number of stages $610_0$ to $610_3$ and the number of clock generating circuits $620_1$ to $620_3$ are not limited thereto. The stages $610_0$ to $610_3$ are in a sequence with one of the clock generating circuits $620_1$ to $620_3$ between each of the stages. The clock generating circuits $620_1$ to $620_3$ may also be in a sequence. A next stage may refer to a stage which receives input from a previous stage in the sequence. Restated a previous stage may provide an input to a next stage. For example, when the TDC circuit 600 decide n bits, the TDC circuit 600 may include n stages and (n−1) clock generating circuits.

Each stage $610_i$ may receive a positive pulse $Tinp_i$ and a negative pulse $Tinn_i$. Here, i is an integer between 0 and 3. Each stage $610_i$ may compare the positive pulse $Tinp_i$ and the negative pulse $Tinn_i$ in response to an input clock $CLK_i$ of a corresponding stage $610_i$, and decide a bit $D_i$ of the corresponding stage $610_i$ based on a comparison result. In some example embodiments, each stage $610_i$ may compare a start edge of the positive pulse $Tinp_i$ with a start edge of the negative pulse $Tinn_i$, decide the bit $D_i$ as '1' if the start edge of the positive pulse $Tinp_i$ is earlier than the start edge of the negative pulse $Tinn_i$, and decide the bit $D_i$ as '0' if the start edge of the negative pulse $Tinn_i$ is earlier than the start edge of the positive pulse $Tinp_i$. When the TDC circuit 600 includes the four stages $610_0$ to $610_3$, the TDC circuit 600 may decide four bits $D_0$ to $D_3$. In this case, among the four bits, the first stage $610_0$ (or start stage) may decide the most significant bit $D_0$ the second stage $610_1$ may decide the second most significant bit $D_1$, the third stage $610_2$ may decide the third most significant bit $D_2$, and the fourth stage $610_3$ may decide the least significant bit $D_3$. The start stage does not have a previous stage in the sequence of stages.

Each stage $610_i$ may output input pulses $Tinp_{i+1}$ and $Tinn_{i+1}$ of a next stage $610_{i+1}$ by delaying either the positive pulse $Tinp_i$ or the negative pulse $Tinn_i$ by a reference time of the corresponding stage $610_i$ based on the comparison result (e.g., the decided bit) and without delaying the other pulse by the reference time of the corresponding stage $610_i$. In some example embodiments, the stage $610_i$ may delay two pulses $Tinp_i$ and $Tinn_i$ by a basic delay value, and then output the input pulses $Tinp_{i+1}$ and $Tinn_{i+1}$ of the next stage $610_{i+1}$ by delaying one pulse by the reference time of the corresponding stage $610_i$ and without delaying the other pulse. For example, when the comparison result indicates that the start edge of the positive pulse $Tinp_i$ is earlier than the start edge of the negative pulse $Tinn_i$ (e.g., when the decided bit $D_i$ is '1'), the stage $610_i$ may output the pulse $Tinp_{i+1}$ by delaying the positive pulse $Tinp_i$ by the reference time, and output the pulse $Tinn_{i+1}$ without delaying the negative pulse $Tinn_i$. When the comparison result indicates that the start edge of the negative pulse $Tinn_i$ is earlier than the start edge of the positive pulse $Tinp_i$ (e.g., when the decided bit $D_i$ is '0'), the stage $610_i$ may output the pulse $Tinp_{i+1}$ without delaying the positive pulse $Tinp_i$, and output the pulse $Tinn_{i+1}$ by delaying the negative pulse $Tinn_i$ by the reference time. In this case, the first stage $610_0$ may receive pulses input to the TDC circuit 600 (e.g., output pulses Tinp and Tinn of the VTC circuit shown in FIG. 2) as the input pulses $Tinp_0$ and $Tinn_0$. Further, since the last stage $610_3$ does not have a next stage, the last stage $610_3$ may not delay the input pulses $Tinp_3$ and $Tinn_3$.

The TDC circuit 600 may use a binary search. Accordingly, each stage $610_{i+1}$ may use half of the reference time of the previous stage $610_i$ as its own reference time. In this case, the first stage $610_0$ may use half of a reference time Tref of the TDC circuit 600 as its own reference time Tref/2. Accordingly, the second stage $610_1$ may use Tref/4 as its own reference time, and the third stage $610_1$ may use Tref/8 as its own reference time.

The first stage $610_0$ may receive an input clock $CLK_0$ of the TDC circuit 600 as its own clock and decide the bit $D_0$ of the corresponding stage $610_0$ in response to the input clock $CLK_0$. Each (or alternatively, at least one) of stages $610_i$ other than the first stage $610_0$ may decide the bit $D_i$ of the corresponding stage $610_i$ in response to a clock $CLK_i$ generated by the corresponding clock generating circuit $620_i$. Here, i is an integer between 1 and 3. The clock generating circuit $620_i$ may generate the clock $CLK_i$ of the corresponding stage $620_i$ in response to an operation of the previous stage $620_{i-1}$. In some example embodiments, the clock generating circuit $620_i$ may generate a start edge (e.g., a rising edge) of the clock $CLK_i$ of the corresponding stage $620_i$ in response to the operation of the previous stage $620_{i-1}$. In some example embodiments, the clock generating circuit $620_i$ may reset the clock $CLK_i$ of the corresponding stage $620_i$ in response to an operation of the corresponding stage $620_i$. In some other example embodiments, the clock generating circuit $620_i$ may reset the clock $CLK_i$ of the corresponding stage $620_i$ when the clock $CLK_{i+1}$ is generated in the next clock generating circuit $620_{i+1}$. In some example embodiments, the clock generating circuit $620_i$ may reset the clock $CLK_i$ by generating an end edge (e.g., a falling edge) of the clock $CLK_i$ of the corresponding stage $620_i$.

In some example embodiments, the operation of the stage $620_i$ may be a comparison operation in the stage $620_i$. In this case, the clock generating circuit $620_i$ may generate the clock $CLK_i$ of the corresponding stage $620_i$ in response to the comparison result (e.g., the decision result) of the previous stage $620_{i-1}$. The clock generating circuit $620_i$ may reset the clock $CLK_i$ of the corresponding stage $620_i$ in response to the comparison result (e.g., the decision result) of the corresponding stage $620_i$.

In some example embodiments, when the clock $CLK_i$ of the stage $620_i$ is reset, the comparison result of the corresponding stage $620_i$ may be reset for the next operation.

As shown in FIG. 7, for example, a positive pulse $Tinp_0$ and a negative pulse Tinn0 later than the positive pulse $Tinp_0$ may be input to the first stage $610_0$. When the input clock $CLK_0$ has an active level (e.g., a high level as a logic level) by a start edge (e.g., a rising edge) of the input clock $CLK_0$. the first stage $610_0$ may compare the positive pulse $Tinp_0$ and the negative pulse $Tinn_0$. In an example shown in FIG. 7, because the positive pulse $Tinp_0$ is earlier than the negative pulse $Tinn_0$, the first stage $610_0$ may decide '1' based on a comparison result. Further, because the positive pulse $Tinp_0$ is earlier than the negative pulse $Tinn_0$, the first stage $610_0$ may output an input pulse $Tinp_1$ of the second stage $610_1$ by delaying the positive pulse $Tinp_0$ by half Tref/2 of the reference time Tref of the TDC circuit 600, and output an input pulse $Tinn_1$ of the second stage 610₁ without delaying the negative pulse $Tinn_0$ by half Tref/2 of the reference time Tref. The first clock generating circuit 620₁ may activate a clock $CLK_1$ when the comparison is completed in the stage 610₀ (e.g., when the comparison result is generated in the stage 610₀). The first clock generating circuit 620₁ may activate the clock $CLK_1$ by generating a start edge (e.g., a rising edge) of the clock $CLK_1$.

When the clock $CLK_1$ output from the clock generating circuit 620₁ has the active level, the second stage 610₁ may compare the positive pulse $Tinp_1$ and the negative pulse $Tinn_1$ input from the first stage 610₀. In the example shown in FIG. 7, because the positive pulse $Tinp_1$ is earlier than the negative pulse $Tinn_1$, the second stage 610₁ may decide '1' based on a comparison result. Further, because the positive pulse $Tinp_1$ is earlier than the negative pulse $Tinn_1$, the second stage 610₁ may output an input pulse $Tinp_2$ of the third stage 610₂ by delaying the positive pulse $Tinp_1$ by half Tref/4 of the reference time Tref/2 of the previous stage 610₀, and output an input pulse $Tinn_2$ of the third stage 610₂ without delaying the negative pulse $Tinn_1$ by half Tref/4 of the reference time Tref/2. The first clock generating circuit 620₁ may deactivate the clock $CLK_1$ when the comparison is completed in the stage 610₁. The first clock generating circuit 620₁ may deactivate the clock $CLK_1$ by generating an end edge (e.g., a falling edge) of the clock $CLK_1$. Further, the second clock generating circuit 620₂ may activate a clock $CLK_2$ when the comparison is completed in the stage 610₁.

When the clock $CLK_2$ output from the clock generating circuit 620₂ has the active level, the third stage 610₂ may compare the positive pulse $Tinp_2$ and the negative pulses $Tinn_2$ input from the second stage 610₁. In the example shown in FIG. 7, because the positive pulse $Tinp_2$ is earlier than the negative pulse $Tinn_2$, the third stage 610₂ may decide '1' based on a comparison result. Further, because the positive pulse $Tinp_2$ is earlier than the negative pulse $Tinn_2$, the third stage 610₂ may output an input pulse $Tinp_3$ of the fourth stage 610₃ by delaying the positive pulse $Tinp_2$ by half Tref/8 of the reference time Tref/4 of the previous stage 610₁, and output an input pulse $Tinn_3$ of the fourth stage 610₃ without delaying the negative pulse $Tinn_2$ by half Tref/8 of the reference time Tref/4. The second clock generating circuit 620₂ may deactivate the clock $CLK_2$ when the comparison is completed in the stage 610₂. Further, the third clock generating circuit 620₃ may activate a clock $CLK_3$ when the comparison is completed in the stage 610₂.

When the clock $CLK_2$ output from the clock generating circuit 620₂ has the active level, the fourth stage 610₃ may compare the positive pulse $Tinp_3$ and negative pulse $Tinn_3$ input from the third stage 610₂. In the example shown in FIG. 7, because the negative pulse $Tinn_3$ is earlier than the positive pulse $Tinp_3$, the fourth stage 610₃ may decide '0' based on a comparison result. The third clock generating circuit 620₃ may deactivate the clock $CLK_3$ when the comparison is completed in the stage 610₃.

Through the above-described processes, the TDC circuit 600 may convert the input voltage into a digital signal $D_0$ to $D_3$ having "1110".

If each stage 610ᵢ does not use its own clock $CLK_i$ and the plurality of stages 610₀ to 610₃ use the same clock, the clock should maintain the active level until the input pulse is propagated through the plurality of stages 610₀ to 610₃. Therefore, because each stage 610ᵢ may operate again in the next clock cycle after the decision at the plurality of stages 610₀ to 610₃ is completed, a waiting time of the stage 610ᵢ may increase. However, according to the above-described example embodiments, each stage 610ᵢ may operate in response to its own clock $CLK_i$ without waiting for the completion of the decision at the other stages, so that the waiting time may be reduced. That is, a pipelined successive-approximation TDC circuit may be provided.

Further, a method of generating a clock of a next stage by delaying the input clock $CLK_0$ may be used. This method may increase power consumption in a delay line for delaying the clock, and reset the comparator of the stage before the comparison is completed. However, since the pipelined successive-approximation TDC circuit described above does not use the delay line, power consumption can be reduced. Further, since a decision of a stage is completed and then a next stage operates in response to the clock, the comparator may not be reset before the operation is completed.

Figure 8:
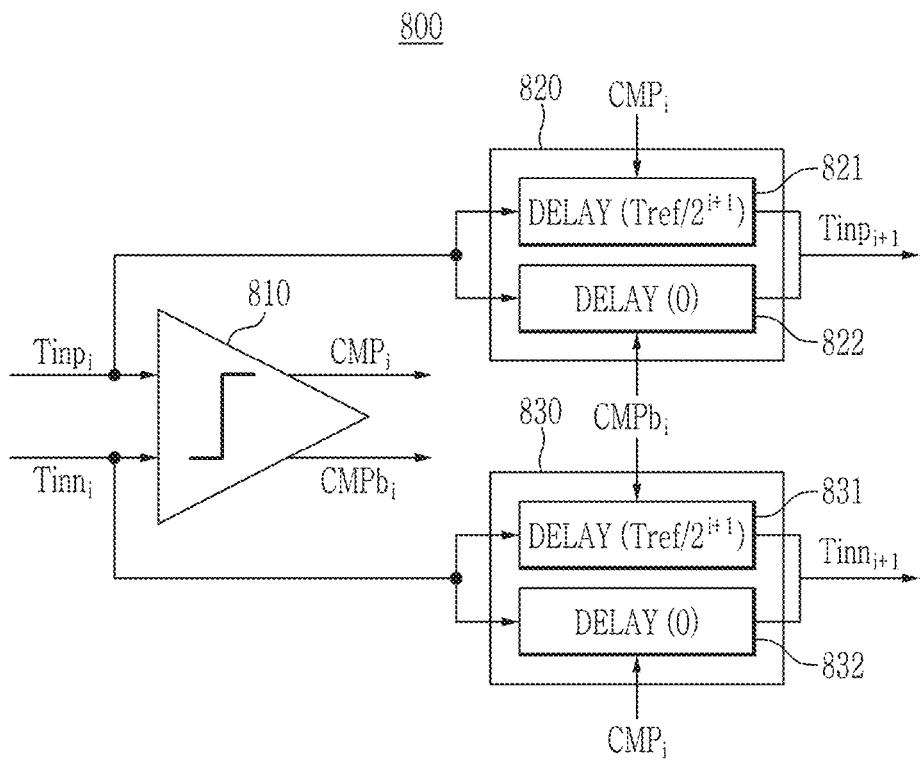
FIG. 8 is a block diagram illustrating an example of a stage in a voltage-to-time converter circuit of an analog-to-digital converter according to some example embodiments.
Figure 9:
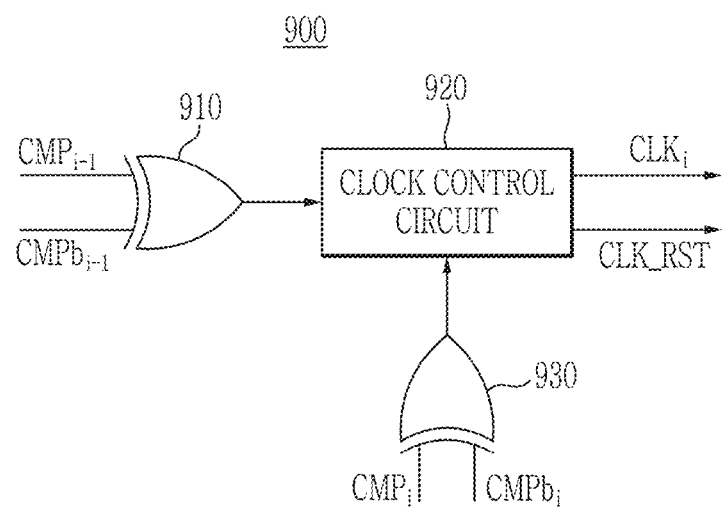
FIG. 9 is a diagram illustrating an example of a clock generating circuit in a voltage-to-time converter circuit of an analog-to-digital converter according to some example embodiments.

FIG. 8 is a block diagram illustrating an example of a stage in a TDC circuit of an analog-to-digital converter according to some example embodiments, and FIG. 9 is a diagram illustrating an example of a clock generating circuit in a TDC circuit of an analog-to-digital converter according to some example embodiments.

Referring to FIG. 8, a stage 800 may include a time comparator 810, and delay circuits 820 and 830.

The time comparator 810 may compare an input positive pulse $Tinp_i$ and an input negative pulse $Tinn_i$. The time comparator 810 may compare a time of a start edge of the positive pulse $Tinp_i$ and a time of a start edge of the negative pulse $Tinn_i$, and output a comparison result $CMP_i$. In some example embodiments, an output of the time comparator 810 may include the output $CMP_i$ and a complementary output $CMPb_i$ having a complementary value of the output. In some example embodiments, the time comparator 810 may output '1' as the output $CMP_i$ when the start edge of the positive pulse $Tinp_i$ is earlier than the start edge of the negative pulse $Tinn_i$, and output '0' as the output $CMP_i$ when the start edge of the positive pulse $Tinp_i$ is later slower than the start edge of the negative pulse $Tinn_i$. The time comparator 810 may output '0' as the complementary output $CMPb_i$ when outputting '1' as the output $CMP_i$, and output '1' as the complementary output $CMPb_i$ when outputting '0' as the output $CMP_i$. The output $CMP_i$ of the time comparator 810 may be a decision value of the stage 800.

The delay circuit 820 may receive the positive pulse $Tinp_i$ and operate in response to the output $CMP_i$ of the time comparator 810. When the output $CMP_i$ of the time comparator 810 has a first value (e.g., '1'), the delay circuit 820 may output an input pulse $Tinp_{i+1}$ of a next stage by delaying the positive pulse $Tinp_i$ by a reference time $Tref/2^{i+1}$ of the stage 800. When the output $CMP_i$ of the time comparator 810 has a second value (e.g., '0'), the delay circuit 820 may output the input pulse $Tinp_{i+1}$ of the next stage without delaying the positive pulse $Tinp_i$ by the reference time $Tref/2^{i+1}$ of the stage 800. In some example embodiments, the delay circuit 820 may include a delay circuit that operates in response to the output $CMP_i$ of the time comparator 810 and delays an input by the reference time $Tref/2^{i+1}$, and a delay circuit 822 that operates in response to the complementary output $CMPb_i$ of the time comparator 810 and does not delays an input by the reference time $Tref/2^{i+1}$.

The delay circuit 830 may receive the negative pulse $Tinn_i$ and operate in response to the output $CMP_i$ of the time comparator 810. When the output $CMP_i$ of the time comparator 810 has the second value, the delay circuit 830 may output an input pulse $Tinn_{i+1}$ of the next stage by delaying the negative pulse $Tinn_i$ by the reference time $Tref/2^{i+1}$ of the stage 800. When the output $CMP_i$ of the time comparator 810 has the first value, the delay circuit 820 may output the input pulse $Tinn_{i+1}$ of the next stage without delaying the negative pulse $Tinn_i$ by the reference time $Tref/2^{i+1}$ of the stage 800. In some example embodiments, the delay circuit 830 may include a delay circuit that operates in response to the complementary output $CMP_i$ of the time comparator 810 and delays an input by the reference time $Tref/2^{i+1}$, and a delay circuit 832 that operates in response to the output $CMP_i$ of the time comparator 810 and does not delay an input by the reference time $Tref/2^{i+1}$.

In some example embodiments, the delay circuits 820 and 830 may delay the pulses $Tinp_i$ and $Tinn_i$ by a basic delay value, respectively.

Referring to FIG. 9, a clock generating circuit 900 may include a logic circuit 910 and a clock control circuit 920, and may receive a comparison result of a previous stage.

The logic circuit 910 may output a signal having a predetermined (or alternatively, desired) level when a comparison between a positive pulse and a negative pulse is completed in the previous stage. In some example embodiments, when the comparison in the previous stage is completed, either one of an output $CMP_{i-1}$ and a complementary output $CMPb_{i-1}$ may have '1' and the other may have '0' in a time comparator of the previous stage. Accordingly, the logic circuit 910 may be an exclusive OR (XOR) gate 910. The XOR gate 910 may receive the output $CMP_{i-1}$ and the complementary output $CMPb_{i-1}$ in the time comparator of the previous stage, and output a signal having '1' when the comparison is completed.

The clock control circuit 920 may generate a clock $CLK_i$ of a corresponding stage when the output of the logic circuit 910 has the predetermined (or alternatively, desired) level (e.g., action level, or action value) (e.g., the action value may be a high level ('1') as a logic level). In some example embodiments, the clock control circuit 920 may generate the clock $CLK_i$ by generating a start edge of the clock $CLK_i$ of the corresponding stage.

In some example embodiments, the clock control circuit 920 may further include a logic circuit 930 that outputs a signal having a predetermined (or alternatively, desired) level when a comparison between the positive pulse and the negative pulse is completed in the corresponding stage. The logic circuit 930 may be an XOR gate that receives an output $CMP_i$ and a complementary output $CMPb_i$ in a time comparator of the corresponding stage. Accordingly, the clock control circuit 920 may transfer a clock reset signal CLK_RST to the corresponding stage to reset the clock $CLK_i$ when an output of the logic circuit 930 has the predetermined (or alternatively, desired) level (e.g., the high level ('1') as a logic level).

In some other example embodiments, when the output of the logic circuit 910 has the predetermined (or alternatively, desired) level, the clock control circuit 920 may transfer the clock reset signal CLK_RST to the clock control circuit 920 corresponding to the previous stage. The clock control circuit 920 corresponding to the previous stage may reset the clock $CLK_{i-1}$ in response to the clock reset signal CLK_RST. In this case, the clock control circuit 920 may reset the clock $CLK_i$ in response to the clock reset signal CLK_RST transferred from the clock control circuit 920 corresponding to a next stage.

In some example embodiments, when the clock $CLK_i$ of a stage is reset, a time comparator (e.g., 810 in FIG. 8) of the corresponding stage may be reset for a next operation. When the time comparator 810 is reset, the time comparator 810 may output the same value (e.g., '0') as the output $CMP_i$ and the complementary output $CMPb_i$.

Figure 10:
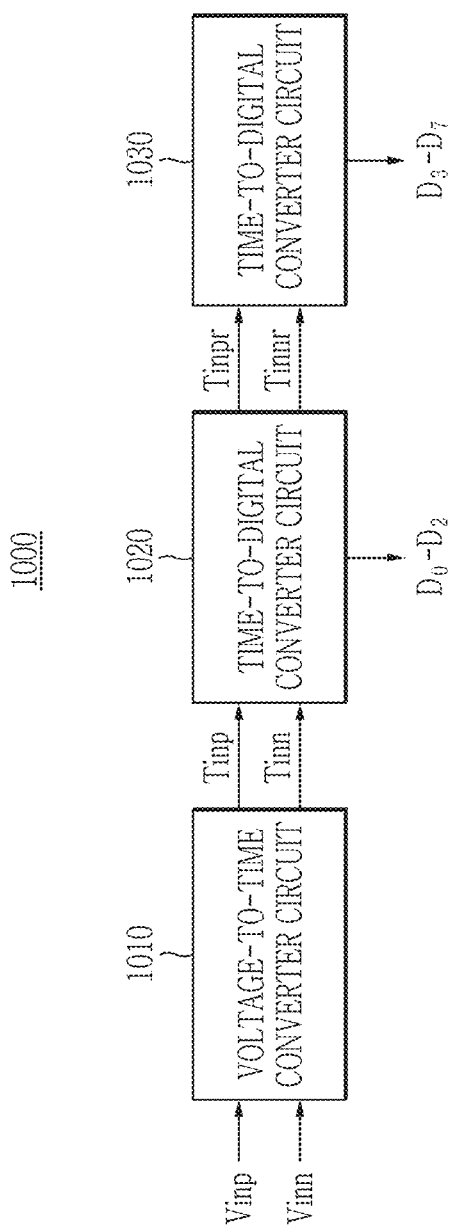
FIG. 10 is a block diagram illustrating an example of an analog-to-digital converter according to some example embodiments.

FIG. 10 is a block diagram illustrating an example of an analog-to-digital converter according to some example embodiments.

Referring to FIG. 10, an analog-to-digital converter 1000 may include a VTC circuit 1010, a first TDC circuit 1020, and a second TDC circuit 1030. The analog-to-digital converter 1000 may convert analog input voltages Vinp and Vinn into a digital signal having a plurality of bits (e.g., eight bits). In this case, the analog-to-digital converter 1000 may perform a fine decision after performing a coarse decision.

As described with reference to FIG. 1, the VTC circuit 1010 may convert the input voltages Vinp and Vinn into time domain pulses Tinp and Tinn.

The first TDC circuit 1020 may perform the coarse decision. The first TDC circuit 1020 may decide a predetermined (or alternatively, desired) number (e.g., three) of the most significant bits $D_0$ to $D_2$ among the eight bits from the input pulses Tinp and Tinn, and output a positive pulse Tinpr and a negative pulse Tinnr as a residual signal corresponding to remaining bits (e.g., the lower five bits) $D_3$ to $D_7$.

The second TDC circuit 1030 may perform the fine decision. The second TDC circuit 1030 may receive the residual signal Tinpr and Tinnr output from the first TDC circuit 1020 as input pulses, and decide the five bits $D_3$ to $D_7$ from the input pulses Tinpr and Tinnr.

In some example embodiments, both the first TDC circuit 1020 and the second TDC circuit 1030 may be implemented as a pipelined successive-approximation TDC described above.

In some other example embodiments, the second TDC circuit 1030 may be implemented as the pipelined successive-approximation TDC, and the first TDC circuit 1020 may be implemented as a faster TDC than the pipelined successive-approximation TDC. For example, the first TDC circuit 1020 may be implemented as a flash TDC.

Figure 11:
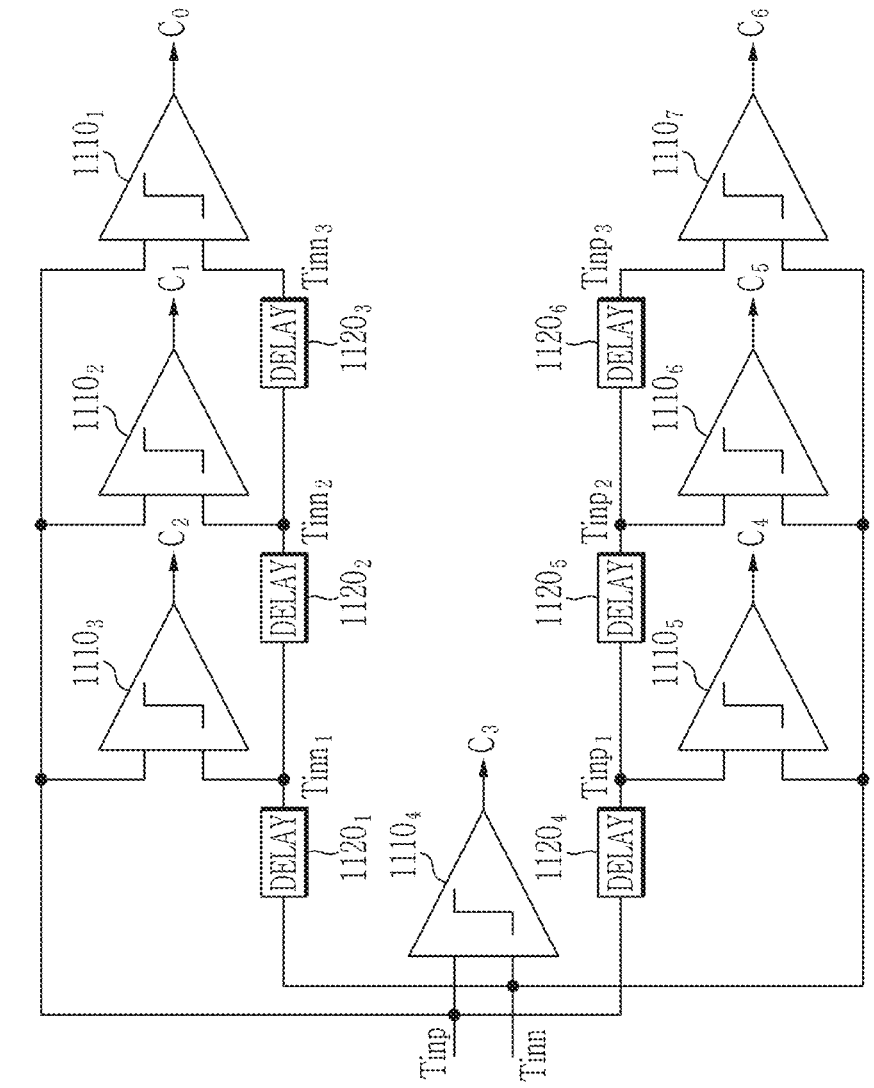
FIG. 11 is a block diagram illustrating an example of a flash voltage-to-time converter circuit according to some example embodiments.
Figure 12:
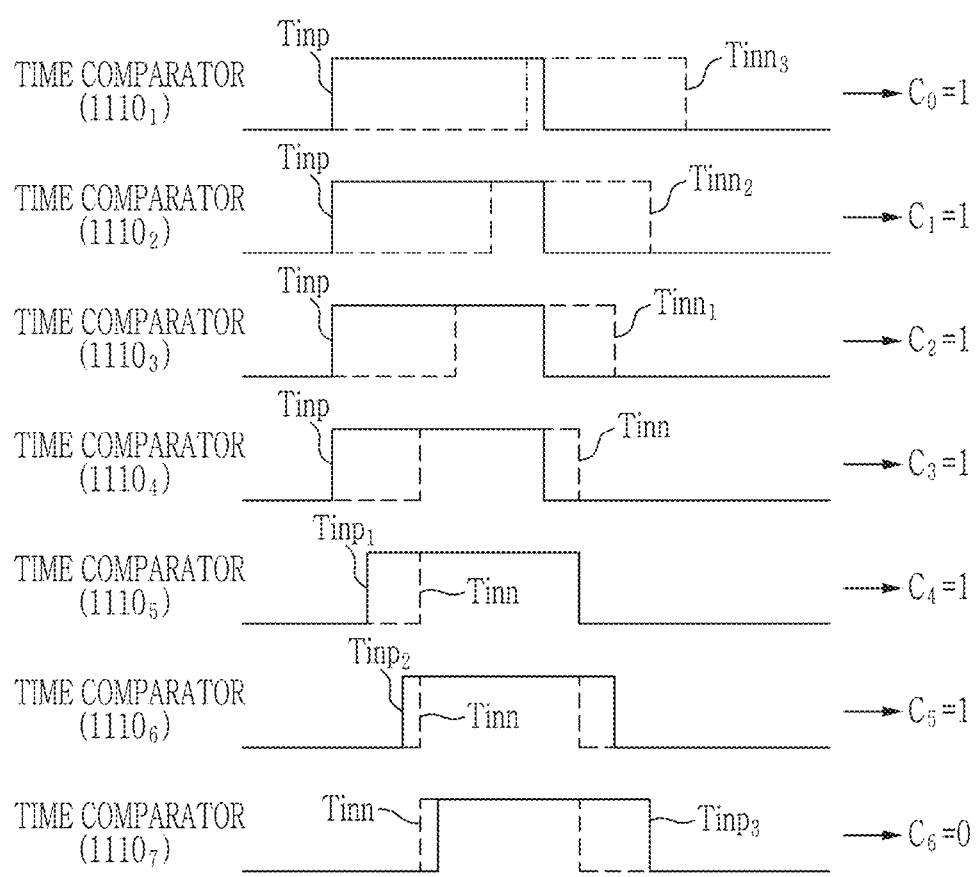
FIG. 12 is a diagram showing an example of a signal generated in a flash voltage-to-time converter circuit shown in FIG. 11.

FIG. 11 is a block diagram illustrating an example of a flash TDC circuit according to some example embodiments, and FIG. 12 is a diagram showing an example of a signal generated in a flash TDC circuit shown in FIG. 11.

Referring to FIG. 11, a flash TDC circuit 1100 may include a plurality of time comparators $1110_1$, $1110_2$, $1110_3$, $1110_4$, $1110_5$, $1110_6$, and $1110_7$, and a plurality of delay circuits $1120_1$, $1120_2$, $1120_3$, $1120_4$, $1120_5$, and $1120_6$. Although FIG. 11 shows seven time comparators $1110_1$ to $1110_7$ and six delay circuits $1120_1$ to $1120_6$, the number of time comparators $1110_1$ to $1110_7$ and the number of delay circuits $1120_1$ to $1120_6$ are not limited thereto. For example, if the flash TDC circuit 1100 decides n bits, the flash TDC circuit 1100 may include $(2^n-1)$ time comparators and $(2^n-2)$ delay circuits.

Each (or alternatively, at least one) of the delay circuits $1120_1$ to $1120_6$ may delay an input pulse by a reference time. When the flash TDC circuit 1100 decides the n bits, the reference time may be $\frac{1}{2^n}$ of a reference time Tref of the flash TDC circuit 1100. In an example shown in FIG. 11 and FIG. 12, the reference time may be Tref/4. The delay circuit $1120_1$ may output a negative pulse Tinn by delaying an input negative pulse Tinn by the reference time Tref/4, the delay circuit $1120_2$ may output a negative pulse $Tinn_2$ by delaying the negative pulse $Tinn_1$ output from delay circuit $1120_1$ by the reference time Tref/4, and the delay circuit $1120_3$ may output a negative pulse $Tinn_3$ by delaying the negative pulse $Tinn_2$ output from delay circuit $1120_2$ by the reference time Tref/4. Accordingly, the negative pulse $Tinn_2$ may be delayed by $2T_{ref}/4$ from the input negative pulse Tinn, and the negative pulse $Tinn_3$ may be delayed by $3T_{ref}/4$ from the input negative pulse Tinn. The delay circuit $1120_4$ may output a positive pulse $Tinp_1$ by delaying an input positive pulse Tinp by the reference time $T_{ref}/4$, the delay circuit $1120_5$ may output a positive pulse $Tinp_2$ by delaying the positive pulse $Tinp_1$ output from delay circuit $1120_4$ by the reference time $T_{ref}/4$, and the delay circuit $1120_6$ may output a positive pulse $Tinp_3$ by delaying the positive pulse $Tinp_2$ output from delay circuit $1120_5$ by the reference time $T_{ref}/4$. Accordingly, the positive pulse $Tinp_2$ may be delayed by $2T_{ref}/4$ from the input positive pulse Tinp, and the positive pulse $Tinp_3$ may be delayed by $3T_{ref}/4$ from the input positive pulse Tinp.

Each (or alternatively, at least one) of the time comparators $1110_1$ to $1110_7$ may compare a positive pulse and a negative pulse, and decide a corresponding one among bits $C_0$ to $C_6$ based on a comparison result. In some example embodiments, the time comparators $1110_1$ to $1110_7$ may compare a start edge of the positive pulse with a start edge of the negative pulse, decide '1' if the start edge of the positive pulse is earlier than the start edge of the negative pulse, and decide '0' if the start edge of the negative pulse is earlier than the start edge of the positive pulse.

The time comparators $1110_1$ to $1110_4$ may receive the input positive pulse Tinp as the positive pulse, and the time comparators $1110_4$ to $1110_7$ may receive the input negative pulse Tinn as the negative pulse. The time comparator $1110_1$ may receive the negative pulse $Tinn_3$ output from the delay circuit $1120_3$ as the negative pulse, the time comparator $1110_2$ may receive the negative pulse $Tinn_2$ output from the delay circuit $1120_2$ as the negative pulse, and the time comparator $1110_3$ may receive the negative pulse $Tinn_1$ output from the delay circuit $1120_1$ as the negative pulse. The time comparator $1110_5$ may receive the positive pulse $Tinp_1$ output from the delay circuit $1120_4$ as the positive pulse, the time comparator $1110_6$ may receive the positive pulse $Tinp_2$ output from the delay circuit $1120_5$ as the positive pulse, and the time comparator $1110_7$ may receive the positive pulse $Tinp_3$ output from the delay circuit $1120_6$ as the positive pulse.

As shown in FIG. 12, for example, the input positive pulse Tinp and the input negative pulse Tinn may be input to the TDC circuit 1200, and the input negative pulse Tinn may be later than the input positive pulse Tinp by a time longer than $2T_{ref}/4$ and shorter than $3T_{ref}/4$. Then, because the input positive pulse Tinp is earlier than the negative pulse $Tinn_3$ delayed by $3T_{ref}/4$ from the input negative pulse Tinn, the time comparator $1110_1$ may decide the bit $C_0$ as '1'. Because the input positive pulse Tinp is earlier than the negative pulse $Tinn_2$ delayed by $2T_{ref}/4$ from the input negative pulse Tinn, the time comparator $1110_2$ may also decide the bit $C_1$ as '1'. Because the input positive pulse Tinp is earlier than the negative pulse $Tinn_2$ delayed by $T_{ref}/4$ from the input negative pulse Tinn, the time comparator $1110_3$ may also decide the bit $C_2$ as '1'. Because the input positive pulse Tinp is earlier than the input negative pulse Tinn, the time comparator $1110_4$ may also decide the bit $C_3$ as '1'. Because the positive pulse $Tinp_1$ delayed by $T_{ref}/4$ from the input positive pulse Tinp is earlier than the input negative pulse Tinn, the time comparator $1110_5$ may also decide the bit $C_4$ as '1'. Because the positive pulse $Tinp_1$ delayed by $2T_{ref}/4$ from the input positive pulse Tinp is earlier than the input negative pulse Tinn, the time comparator $1110_6$ may also decide the bit $C_5$ as '1'. Because the positive pulse $Tinp_1$ delayed by $3T_{ref}/4$ from the input positive pulse Tinp is later than the input negative pulse Tinn, the time comparator $1110_7$ may decide the bit $C_6$ as '0'.

Therefore, the flash TDC circuit 1100 may output a decision code $C_0$ to $C_6$ of "1111110". The decision code $C_0$ to $C_6$ of "1111110" may be a thermometer code, and may correspond to "110" in a binary digital code. Since the flash TDC circuit 1100 may output all digital values in one clock cycle, it may operate faster than a pipelined successive-approximation TDC circuit.

As described above, in some example embodiments, when the flash TDC circuit is used as the first TDC circuit 1020 in FIG. 10, the analog-to-digital converter may operate faster. In some example embodiments, when the pipelined successive-approximation TDC circuit is used as the first TDC circuit 1020 in FIG. 10, the number of time comparators may be reduced. For example, for n-bit decision, n time comparators may be used in the pipelined successive-approximation TDC circuit, whereas ($2^n-1$) time comparators may be used in the flash TDC circuit.

Figure 13:
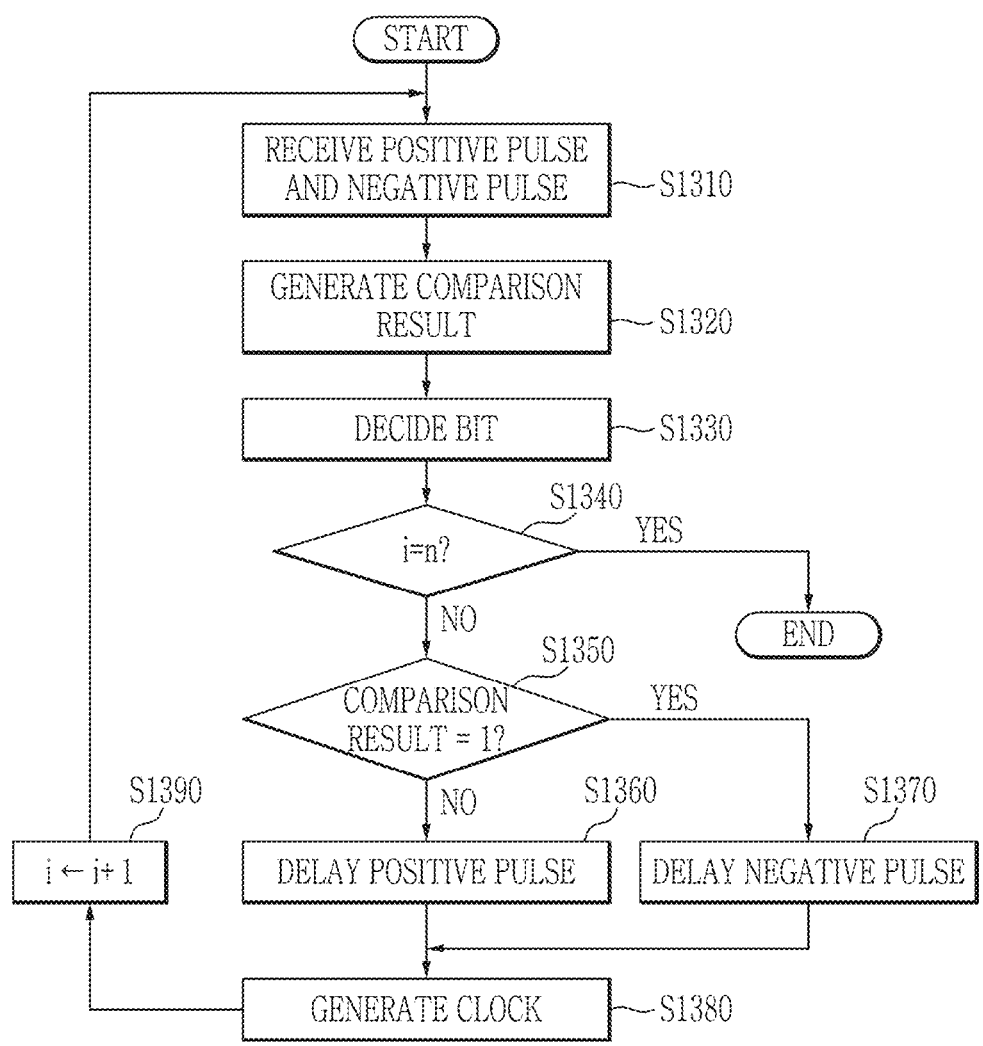
FIG. 13 is a flowchart illustrating an example of an analog-to-digital converting method according to some example embodiments.

FIG. 13 is a flowchart illustrating an example of an analog-to-digital converting method according to some example embodiments.

Referring to FIG. 13, an analog-to-digital converter may receive the $i^{th}$ positive pulse and the $i^{th}$ negative pulse at the $i^{th}$ stage in S1310. In some example embodiments, the first positive pulse and the first negative pulse of the first stage may be pulses generated by converting an input voltage into a time domain. In some example embodiments, the first positive pulse and the first negative pulse may be pulses that is remained after some bits (or alternatively, at least one bit) are decided from the pulses generated by converting the input voltage into the time domain.

In the $i^{th}$ stage, the analog-to-digital converter may generate the $i^{th}$ comparison result by comparing the $i^{th}$ positive pulse and the $i^{th}$ negative pulse in response to the $i^{th}$ clock in S1320. The analog-to-digital converter may decide the $i^{th}$ bit based on the $i^{th}$ comparison result in S1330. When the $i^{th}$ stage is the last stage (e.g., the $n^{th}$ stage) in S1340, the analog-to-digital converter may end the decision.

When the $i^{th}$ stage is not the last stage in S1340, the analog-to-digital converter may output the $(i+1)^{th}$ positive pulse and the $(i+1)^{th}$ negative pulse by delaying either one of the $i^{th}$ positive pulse and the $i^{th}$ negative pulse by the $i^{th}$ reference time based on a value of the $i^{th}$ comparison result in S1350, S1360, and S1370. Further, the analog-to-digital converter may generate the $(i+1)^{th}$ clock in response to the $i^{th}$ comparison result in S1380. In some example embodiments, the analog-to-digital converter may generate a first value (e.g., '1') as the $i^{th}$ comparison result if the $i^{th}$ positive pulse is earlier than the $i^{th}$ negative pulse, and generate a second value (e.g., '0') different from the first value as the $i^{th}$ comparison result if the $i^{th}$ negative pulse is earlier than the $i^{th}$ positive pulse. In some example embodiments, when the $i^{th}$ comparison result has the first value in S1350, the analog-to-digital converter may delay the $i^{th}$ positive pulse by the $i^{th}$ reference time in S1360. When the $i^{th}$ comparison result has the second value in S1350, the analog-to-digital converter may delay the $i^{th}$ negative pulse by the $i^{th}$ reference time in S1370.

Next, the analog-to-digital converter may perform a decision at the $(i+1)^{th}$ stage in S1390.

Figure 14:
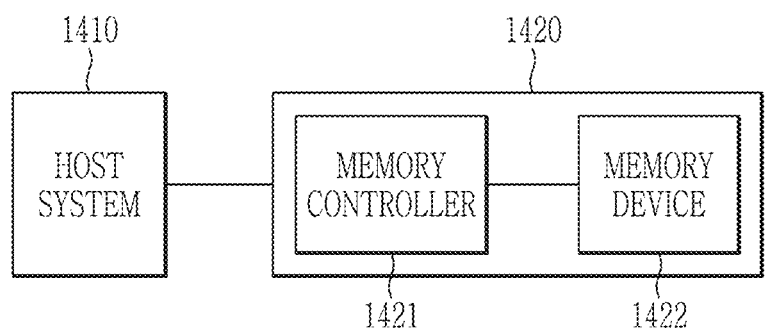
FIG. 14 is a block diagram illustrating an example of a computing device according to some example embodiments.

FIG. 14 is a block diagram illustrating an example of a computing device according to some example embodiments.

Referring to FIG. 14, a computing device 1400 may include a host system 1410 and a memory system 1420. The host system 1410 and the memory system 1420 may communicate through an interface. The memory system 1420 may include a memory controller 1421 and a memory device 1422.

The memory controller 1421 may control a memory operation of the memory device 1422 by providing a signal to the memory device 1422 in response to a request from the host system 1410. The signal may include a command and an address. The memory controller 1421 may read data from the memory device 1422 by providing a read signal to the memory device 1422. Further, the memory controller 1421 may write data into the memory device 1422 by providing a write signal and the data to the memory device 1422.

In some example embodiments, the memory device 1422 may include a volatile memory such as a dynamic random-access memory (DRAM). In some example embodiments, the memory device 1422 may include a non-volatile memory such as a flash memory, a phase-change memory, a resistive memory, a magnetoresistive memory, a ferroelectric memory, or a polymer memory. In some example embodiments, the memory device 1422 may be used as a system memory of host system 1410. In this case, the memory controller 1421 may be provided as a separate chip from a processor of the host system 1410, or may be provided as an internal component of the processor. In some example embodiments, the memory system 1420 may be used as a storage device for the host system 1410.

An analog-to-digital converter described with reference to FIG. 1 to FIG. 13 may be included in the host system 1410, the memory controller 1421, and/or the memory device 1422 to convert an analog voltage into a digital signal.

Figure 15:
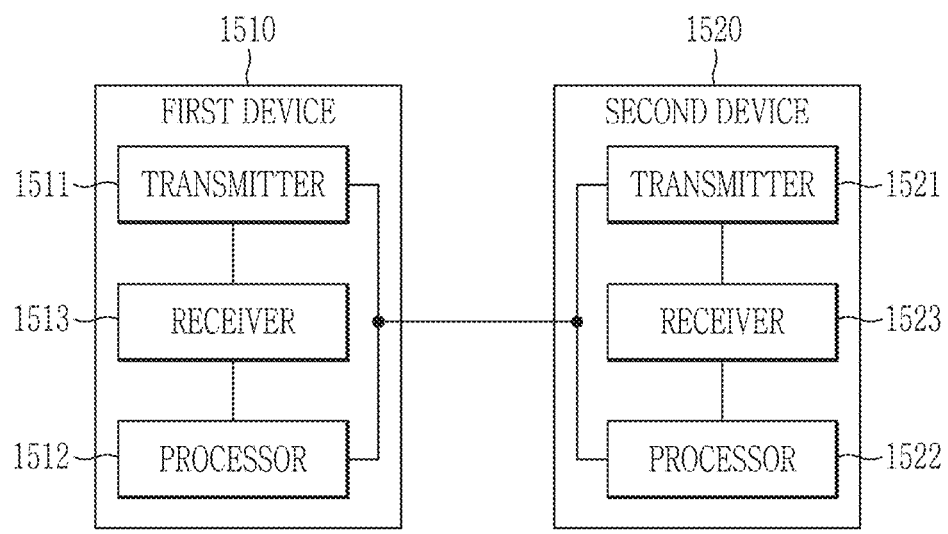
FIG. 15 is a block diagram illustrating an example of a communication system according to some example embodiments.

FIG. 15 is a block diagram illustrating an example of a communication system according to some example embodiments.

Referring to FIG. 15, a communication system 1500 may include a first device 1510 and a second device 1520.

The first device 1510 may include a transmitter 1511, a receiver 1512, and a processor 1513, and the second device 1520 may include a transmitter 1521, a receiver 1522, and a processor 1523. The transmitter 1511 of the first device 1510 may transmit data to the second device 1520, and the receiver 1522 of the second device 1520 may receive the data. Similarly, the transmitter 1521 of the second device 1520 may transmit data to the first device 1510, and the receiver 1512 of the first device 1510 may receive the data. The processor 1513 may control operations of the transmitter 1511 and the receiver 1512, and the processor 1523 may control operations of the transmitter 1521 and the receiver 1522.

An analog-to-digital converter described with reference to FIG. 1 to FIG. 13 may be included in the transmitter 1511, the receiver 1512, the transmitter 1521, and/or the receiver 1522 to convert an analog voltage into a digital signal.

Although FIG. 14 and FIG. 15 shows the computing device and the communication system in which the analog-to-digital converter is used, a system or device to which the analog-to-digital converter is used is not limited thereto. The analog-to-digital converter may be used to convert an analog voltage to a digital signal in a variety of devices.

In some example embodiments, each (or alternatively, at least one) of the components, elements, modules, or units represented by a block as illustrated in FIG. 1 to FIG. 12 may be implemented as various numbers of hardware, software, and/or firmware structures that execute respective functions described above, according to some example embodiments. For example, at least one of these components, elements, modules, or units may include various hardware components including a digital circuit, a programmable or non-programmable logic device or array, an application specific integrated circuit (ASIC), or other circuitry using a digital circuit structure, such as a memory, a processor, a logic circuit, a look-up table, etc., that may execute the respective functions through controls of one or more microprocessors or other control apparatuses. Further, at least one of these components, elements, modules, or units may include a module, a program, or a part of code, which contains one or more executable instructions for performing specified logic functions, and executed by one or more microprocessors or other control apparatuses. Furthermore, at least one of these components, elements, modules, or units may further include or may be implemented by a processor that performs the respective functions. Functional aspects of example embodiments may be implemented in algorithms that execute on one or more processors.

Any of the elements and/or functional blocks disclosed above may include or be implemented in processing circuitry such as hardware including logic circuits; a hardware/software combination such as a processor executing software; or a combination thereof. For example, the clock control circuit 920 and memory controller 1421 may be implemented as processing circuitry. The processing circuitry specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

While this invention has been described in connection with what is presently considered to be practical example embodiments, it is to be understood that the invention is not limited to the disclosed example embodiments. On the contrary, it is intended to cover various modifications and equivalent arrangements included within the spirit and scope of the appended claims.

What is claimed is:

1. An analog-to-digital converter comprising:
a plurality of stages configured in a sequence to sequentially decide a plurality of bits in successive-approximation, each of the plurality of stages configured to operate in response to a corresponding clock among a plurality of clocks, and decide a corresponding bit among the plurality of bits from a corresponding positive pulse among a plurality of positive pulses and a corresponding negative pulse among a plurality of negative pulses, the plurality of positive pulses respectively input to the plurality of stages and the plurality of negative pulses respectively input to the plurality of stages; and
a plurality of clock generating circuits respectively corresponding to a plurality of first stages among the plurality of stages, each of the plurality of clock generating circuits configured to generate the corresponding clock of a corresponding stage among the plurality of first stages based on an operation of a previous stage among the plurality of stages, the previous stage being before the corresponding stage in the sequence.

2. The analog-to-digital converter of claim 1, wherein each of the plurality of stages is further configured to
compare the corresponding positive pulse and the corresponding negative pulse to decide the corresponding bit, and
each of a plurality of second stages among the plurality of stages is configured to generate a positive pulse to be input to a next stage among the plurality of positive pulses and a negative pulse to be input to the next stage among the plurality of negative pulses, by delaying either one of the corresponding positive pulse and the corresponding negative pulse by a corresponding reference time among a plurality of references times respectively corresponding to the plurality of second stages, the plurality of second stages not including a last stage in the sequence among the plurality of stages, the next stage being a stage after the corresponding stage in the sequence, the last stage not having a next stage in the sequence.

3. The analog-to-digital converter of claim 2, wherein the operation of the previous stage comprises a comparison operation of a positive pulse input to the previous stage among the plurality of positive pulses and a negative pulse input to the previous stage among the plurality of negative pulses.

4. The analog-to-digital converter of claim 3, wherein each of the plurality of clock generating circuits is further configured to generate the corresponding clock of the corresponding stage in response to a result of the comparison operation in the previous stage.

5. The analog-to-digital converter of claim 3, wherein each of the plurality of clock generating circuits is further configured to reset the corresponding clock of the corresponding stage in response to a result of the comparison operation in the corresponding stage.

6. The analog-to-digital converter of claim 3, wherein each of the plurality of clock generating circuits is further configured to reset the corresponding clock of the corresponding stage in response to generation of a clock in a next clock generating circuit among the plurality of clock generating circuits.

7. The analog-to-digital converter of claim 2, wherein each of the plurality of second stages is further configured to
delay the corresponding positive pulse by the corresponding reference time when deciding the corresponding bit as a first value, or
delay the corresponding negative pulse by the corresponding reference time when deciding the corresponding bit as a second value different from the first value.

8. The analog-to-digital converter of claim 2, wherein, the plurality of second stages include a start stage in the sequence and at least one third stage, the start stage in the sequence not having a previous stage in the sequence, the corresponding reference time of each of the at least one third stage is half of a reference time corresponding to the previous stage among the plurality of reference times.

9. The analog-to-digital converter of claim 1, wherein the plurality of first stages are stages not including a start stage among the plurality of stages in the sequence, the start stage in the sequence not having a previous stage in the sequence.

10. The analog-to-digital converter of claim 9, wherein the corresponding clock of the start stage is an input clock of the analog-to-digital converter.

11. The analog-to-digital converter of claim 1, further comprising a voltage-to-time converter circuit configured to convert a positive input voltage and a negative input voltage into a time domain to generate an input positive pulse and an input negative pulse to be input to a start stage among the plurality of stages in the sequence as the corresponding positive pulse and the corresponding negative pulse of the start stage, respectively, the start stage in the sequence not having a previous stage in the sequence.

12. The analog-to-digital converter of claim 1, further comprising:
a voltage-to-time converter circuit configured to convert a positive input voltage and a negative input voltage into a time domain to generate an input positive pulse and an input negative pulse; and
a time-to-digital converter circuit configured to decide at least one bit based on the input positive pulse and the input negative pulse, and then output a residual positive pulse and a residual negative pulse to be input to a start stage among the plurality of stages in the sequence as the corresponding positive pulse and the corresponding negative pulse, respectively, the start stage in the sequence not having a previous stage in the sequence.

13. An analog-to-digital converter comprising:
a first time comparator configured to operate in response to a first clock, and decide a first bit based on a first comparison result of comparing a first positive pulse and a first negative pulse;
a first delay circuit configured to delay either one of the first positive pulse and the first negative pulse by a first reference time based on a value of the first comparison result;
a clock generating circuit configured to generate a second clock in response to the first comparison result;
a second time comparator configured to operate in response to the second clock, and decide a second bit based on a second comparison result of comparing a second positive pulse and a second negative pulse output from the first delay circuit; and
a second delay circuit configured to delay either one of the second positive pulse and the second negative pulse by a second reference time based on a value of the second comparison result.

14. The analog-to-digital converter of claim 13, wherein the clock generating circuit is further configured to reset the second clock in response to the second comparison result.

15. The analog-to-digital converter of claim 13, wherein the first time comparator is further configured to
output a first value as the first comparison result in response to the first positive pulse being earlier than the first negative pulse, or
output a second value different from the first value as the first comparison result in response to the first negative pulse being earlier than the first positive pulse,
wherein the second time comparator is further configured to
output the first value as the second comparison result in response to the second positive pulse being earlier than the second negative pulse, or
output the second value different as the second comparison result in response to the second negative pulse being earlier than the second positive pulse.

16. The analog-to-digital converter of claim 15, wherein the first delay circuit is further configured to
delay the first positive pulse by the first reference time in response to the first value of the first comparison result, and delay the first negative pulse by the first reference time in response to the second value of the first comparison result, and wherein the second delay circuit is further configured to
  delay the second positive pulse by the second reference time in response to the first value of the second comparison result, and
  delay the second negative pulse by the second reference time in response to the second value of the second comparison result.

17. The analog-to-digital converter of claim 13, wherein the first time comparator is further configured to output a first complementary comparison result having a complementary value of the first comparison result, and wherein the clock generating circuit is further configured to generate the second clock in response to a result of a logical operation on the first comparison result and the first complementary comparison result having an action value.

18. The analog-to-digital converter of claim 17, wherein the logical operation is an exclusive OR operation, and wherein the action value is '1'.

19. The analog-to-digital converter of claim 17, wherein the second time comparator is further configured to output a second complementary comparison result having a complementary value of the second comparison result, and wherein the clock generating circuit is further configured to reset the second clock when a result of a logical operation on the second comparison result and the second complementary comparison result has the action value.

20. An analog-to-digital converting method comprising:

receiving a first positive pulse and a first negative pulse;

comparing the first positive pulse and the first negative pulse in response to a first clock to generate a first comparison result;

deciding a first bit based on a value of the first comparison result;

outputting a second positive pulse and a second negative pulse by delaying either one of the first positive pulse and the first negative pulse by a first reference time based on the value of the first comparison result;

generating a second clock in response to the first comparison result;

comparing the second positive pulse and the second negative pulse in response to the second clock to generate a second comparison result; and deciding a second bit based on a value of the second comparison result.

* * * * *